United States Patent [19]

Haas

[11] Patent Number: 5,121,297

[45] Date of Patent: Jun. 9, 1992

[54] FLEXIBLE PRINTED CIRCUITS

[75] Inventor: Daniel P. Haas, Houston, Tex.

[73] Assignee: Compaq Computer Corporation, Houston, Tex.

[21] Appl. No.: 636,228

[22] Filed: Dec. 31, 1990

[51] Int. Cl.5 ............................................. H05K 1/00
[52] U.S. Cl. ..................................... 361/398; 361/414; 174/254; 174/255; 174/258
[58] Field of Search ....................... 361/398, 413, 414; 174/254, 255, 258

[56] References Cited

U.S. PATENT DOCUMENTS

| | | | |
|---|---|---|---|
| 4,495,546 | 1/1985 | Nakamura et al. | 361/398 |
| 4,851,613 | 7/1989 | Jacques | 361/398 X |
| 4,961,806 | 10/1990 | Gerrie et al. | 361/398 X |
| 4,997,702 | 3/1991 | Gazit et al. | 361/398 X |
| 5,001,604 | 3/1991 | Lusby | 361/398 |

Primary Examiner—Leo P. Picard
Assistant Examiner—Paramita Ghosh
Attorney, Agent, or Firm—Synnestvedt & Lechner

[57] ABSTRACT

The present invention provides flexible, tear-resistant printed circuits comprising first and second electrical conductors and a flexible, insulating core separating and supporting said first and second conductors. The core preferably comprises aromatic polyamide fiber in a resin binder matrix. Rigid/flex circuits including the flexible, tear-resistant printed circuits are disclosed.

30 Claims, 1 Drawing Sheet

FLEXIBLE PRINTED CIRCUITS

The present invention relates to flexible printed circuits and, more particularly, to printed circuit boards having a flexible printed circuit connected to a rigid printed circuit.

Printed circuit boards are now commonly used in numerous and varied applications, ranging from telecommunications equipment to toys. Printed circuit boards typically comprise an insulating substrate and a conductive circuit printed on the substrate. Because printed circuit boards frequently support electronic components, the substrates of such boards are very often configured to possess mechanical strength and rigidity. Thus, most printed circuit boards are rigid, that is, they are strongly resistant to bending and deformation.

Relatively recently, however, the demands of certain circuit board applications have resulted in the development of boards containing both flexible and rigid sections, frequently referred to as rigid/flex circuit boards. In complex electronic equipment, for example, rigid printed circuit boards are very often mounted in a rack or sub-rack which includes grooves for receiving the boards. In the past, such rigid circuit boards were frequently electrically interconnected to each other and to the rest of the electronic equipment by means of surface, or inter-rack, wiring. This configuration was generally acceptable for equipment in which size and cost was not a dominant factor. However, there has been an increasing demand for electronic equipment that is both compact and low cost. Since inter-rack wiring is frequently a painstakingly slow and arduous task, especially as the space between boards is reduced, such demands are very difficult to satisfy with standard rigid printed circuit board configurations.

The relatively recent development of printed circuit boards containing both rigid and flexible sections has alleviated many of the problems associated with inter-rack wiring of rigid printed circuit boards. Rigid/flex circuit boards are disclosed, for example, in U.S. Pat. No. 4,931,134. According to the design disclosed in the patent, the printed circuit board comprises a series of flexible cables or circuit sections connected selectively between a plurality of rigid circuit sections. One method utilized to produce such rigid/flex circuit boards includes the steps of laminating a superstructure comprising rigid, insulative boards to a substrate comprising individual, flexible layers such that the superstructure forms the outermost layers of a rigid laminate composite. Subsequent to the formation of this rigid board, selected portions of the rigid superstructure are severed and removed from the rigid laminate to expose pre-selected areas of the flexible circuit layers. These layers are relatively readily deformable and therefore comprise flexible sections of the circuit board.

Because they are formed during the overall manufacturing process of the printed circuit board, the flexible sections of such rigid/flex circuit boards provide the potential for creating compact, cost-effective electronic equipment. In order for these potential advantages to be achieved, however, such circuit boards must possess certain characteristics. For example, the flexible portions of these printed circuit boards must be capable of withstanding the frequent bending and deformation associated with the processes used to 1) manufacture the board and 2) incorporate it into the electronic equipment in which it will be used. If the circuit board does not possess these characteristics, the overall cost of producing such circuit boards rises dramatically due to the high incidence of waste associated with the manufacture and installation of such units. Furthermore, in order to readily use the rigid/flex circuit board in compact configurations, the flexible portions of the printed circuit should have the ability to bend around very small radii without failure. If the minimum bend radius of the flexible section is too large, the ability to use the boards in compact locations will be undesirably diminished. Accordingly, the flexible circuit section should have the smallest possible minimum bend radius.

While printed circuit boards containing both rigid and flexible circuit sections have heretofore possessed desirable features and properties, prior rigid/flex circuit board configurations have nevertheless been found to exhibit disadvantages. For example, applicant has discovered that the flexible portions of the heretofore used circuit boards are not sufficiently resistant to tear, especially in the region where the flexible section enters the rigid section of the board. Certain of the heretofore used designs have been so susceptible to tear, in fact, that almost half of the boards manufactured according to such designs have been found to be incapable of surviving the manufacturing process. This, in turn, results in low manufacturing yield and/or high incidence of circuit failure during use.

Previous attempts to overcome the lack of tear resistance associated with rigid/flex circuit boards have been only partially successful. For example, attempts have been made to improve the tear resistance of flexible circuits by covering the flexible sections thereof with one or more layers of relatively flexible material, such as polytetrafluoroethylene film, aromatic polyamide fabric, fiberglass fabric, polyimide film, and certain combinations of these. Such attempts have been reported in the paper entitled "The Effect of Reinforcement on the Tear Properties of Flexible Circuits", Andra E. Acton, First International SAMPE Electronics Conference, Jun. 23–25, 1987. This paper reports that while an improvement in tear-resistant properties was observed With the use of certain of the above-noted materials as cover layers, a substantial and unacceptable decrease in the flexibility and processibility of such flexible circuits was also observed. For example, this paper concludes that while Kevlar covering layers provided the greatest benefit in tear resistance, such covering layers also presented the greatest processing difficulties and highest loss of flexibility. Accordingly, such arrangements are generally not acceptable for widespread commercial applications.

Accordingly, it is object of the present invention to provide tear-resistant flexible printed circuits.

It is a further object of the present invention to provide tear-resistant flexible printed circuits which have low values of minimum bend radius.

It is another object of the present invention to provide rigid/flex printed circuit boards that have highly tear-resistant flexible sections.

It is yet another object of the present invention to provide improved rigid/flex printed circuit boards that are adaptable for production by standard manufacturing techniques.

It is a still further object of the present invention to provide computing means, such as compact personal computers, containing rigid/flex printed circuit boards that have flexible sections which are highly tear-resistant and have low values of minimum bend radius.

SUMMARY OF THE INVENTION

Applicant has found that these and other objects are achieved and the disadvantages of the prior art are overcome by flexible circuit boards comprising at least one flexible, highly tear-resistant core and first and second electrical conductors separated by said core. According to preferred embodiments, such highly tear-resistant cores comprise woven aromatic polyamide fiber in a matrix of resin binder, preferably thermosetting plastic resin binder.

According to especially desirable embodiments of the present invention, the circuit board comprises a rigid printed circuit section and a flexible printed circuit configured as described above and connected to the rigid circuit section. In such embodiments, applicant has found that substantial improvement in performance is realized by attaching the highly tear-resistant core of the present flexible circuit to the rigid circuit section. In particular, it is preferred in such embodiments that at least a first portion of the core is bonded to the rigid circuit section.

In an even further preferred embodiment, the circuit board comprises at least one flexible circuit section and at least first and second rigid circuit sections. In such embodiments, the first and second rigid sections are mechanically and electronically connected to one another by the flexible circuit section of the present invention. Connection of the two rigid circuit sections is preferably achieved by having at least a first portion of said flexible circuit core connected, by lamination for example, to said first rigid section and a second portion of the flexible section core connected to the second rigid circuit section.

DETAILED DESCRIPTION OF PREFERRED EMBODIMENTS

Figure 1:
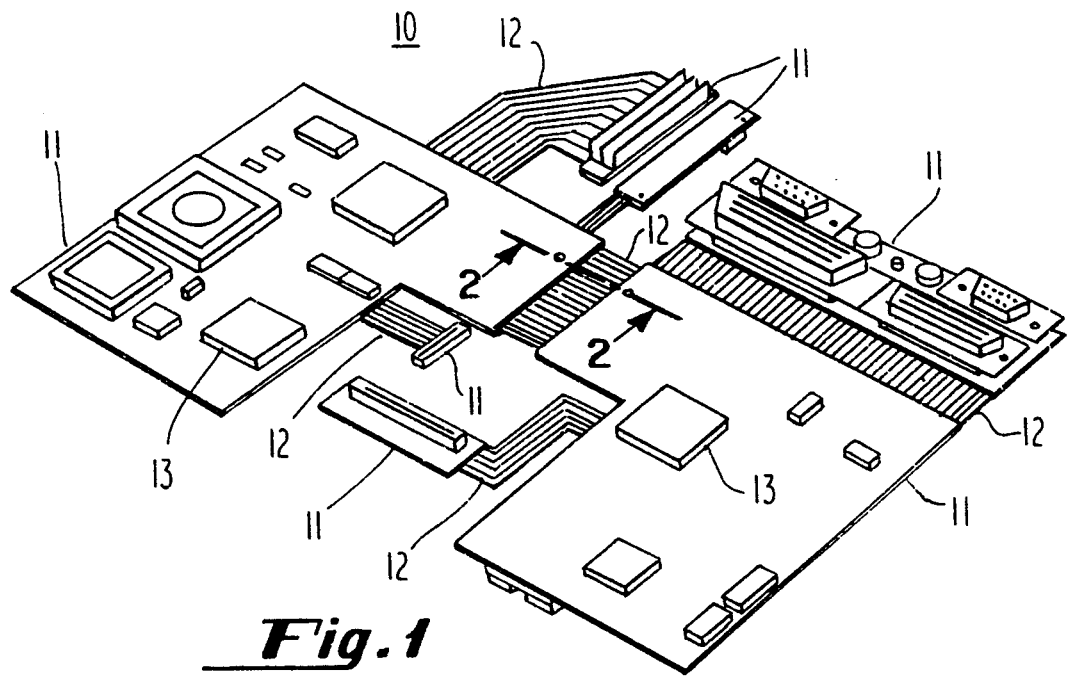
FIG. 1 is a perspective view of a rigid/flex circuit board having rigid printed circuits sections and flexible printed circuit sections according to one embodiment of the present invention.

The present invention provides flexible circuits having improved tear resistance and flexibility. As those skilled in the art are aware, tear-resistance has heretofore been achieved by adding a tear resistant covering layer to the flexible circuit. Applicant has found that the tear resistance provided by such coverings is less than fully satisfactory, as explained more fully hereinafter. Furthermore, the use of tear resistant covering layers according to the prior art also produces a highly undesirable decrease in printed circuit flexibility. In particular, the additional layers of covering material generally result in significant increase in the overall thickness of the final printed circuit and hence a decrease in flexibility. During the bending process, this additional material tends to compress when on the inside of the bend and to stretch when on the outside of the bend. Applicant believes that this bending and stretching of the covering layers not only makes it more lo difficult to deform the printed circuit, but that it also has a tendency to crush the printed circuit on the inside of the bend and to tear the printed circuit on the outside of the bend. Thus, the prior art has provided flexible printed circuits with (1) less than satisfactory tear resistance and (2) diminished flexibility.

According to the present invention, flexible printed circuits are provided which overcome the shortcomings of the prior art. The present flexible circuits generally comprise first and second electrical conductors and a flexible insulating core separating and preferably supporting said conductors. The core is preferably a generally planar layer or sheet of electrically insulating material having first and second generally planar surfaces, said planar surfaces typically being substantially parallel. Conductors are formed on and preferably bound to the first and second surfaces of the core by techniques well known in the art. It is preferred, however, that the conductors be formed by adhering a continuous sheet of conductive material, such as copper, to each side of the core. The layers of conductive material are then imaged and etched in known fashion to provide conductive pads and/or connectors. The number and type of conductors will vary widely and is a matter of design choice which depends upon the particular application involved.

One important aspect of the present invention resides in the properties and characteristics of the insulating core of the flexible printed circuit. In particular, it is preferred that the insulating core comprise a highly tear-resistant core. As used herein, the term highly tear-resistant generally includes materials having a load-at-tear (LAT) of at least about 25 lb./mil as measured by the following test procedure. A sample of the material to be tested is placed in an Instron Model 4204 Mechanical Tester with Series IX automated material testing software. This equipment is used to produce a rotational tear in the materials. The sample is generally rectangular in shape and has a width of about one inch and a length of about 12 inch. For the testing of laminate materials, the one-inch wide strips should be cut from larger sheets at an angle of about 45° to the ply of the laminate. Samples are provided in this manner so as to simulate a rigid/flex circuit configuration in which the core material of the flexible circuit is laid up at a 45° angle to the rigid printed circuit section. The LAT value is then determined by dividing the load-at-tear by the thickness of the sample. It is contemplated that the samples tested according to this method will typically have a thickness of from about 2 to about 12 mil.

Core materials of the present invention preferably have an LAT of at least about 28 lb./mil, with LATs of at least about 30 lb./mil being even more preferred. The flexible circuits of the present invention are themselves preferably highly tear-resistant. That is, the flexible circuits have an LAT of at least about 25 lb./mil, with at least about 28 and 30 lb./mil being even more preferred.

The core of the flexible circuits of the present invention, as well as the flexible circuits themselves, also preferably exhibit improved or at least substantially undiminished flexibility. As described above, prior attempts to improve tear-resistance have resulted in thicker and less flexible printed circuits. Since the present invention does not require the previously used cover layers to impart tear resistance, the present printed circuits are generally thinner and hence more flexible than prior art configurations. Thus, the herein described flexible printed circuits are at once more tear resistant and more flexible than previous flexible circuits. In particular, the tear resistant flexible printed circuit boards of the present invention are preferably less than about 12 mil in overall thickness, and even more preferably less than about 10 mil. It is contemplated that the overall thickness of the flexible circuit may even be less than about 8 mil according to certain embodiments. Furthermore, the core of the flexible circuits of the present invention, as well as the flexible circuits themselves, possess low values for minimum bend radius. It is preferred that the flexible circuits of the present invention have a minimum bend radius no greater than about 10 times, and even more preferably no greater than about 8 times, the overall thickness of the flexible circuit. As the term is used herein, bend radius refers to the inside radius of the arcuate portion of the bend in a sample sheet of flexible material. The bend in the sample sheet is produced by bending the sheet around a smooth cylinder of constant and known radius. The term minimum bend radius refers to the smallest bend radius such a sample sheet is able to withstand without failure. As the term is used herein, failure refers to the formation of cracks, tears or other strength-weakening deformations in the sample being tested after at least 25 cycles of bending. The preferred cores of the present invention have a minimum bend radius of no greater than about 50 mil, more preferably no greater than about 30 mil, and even more preferably no greater than about 25 mil. Furthermore, the preferred cores of the present invention are capable of withstanding at least about 50 cycles, and even more preferably 100 cycles, of bending to the minimum radius without failure.

Similarly, the flexible circuits of the present invention preferably have a minimum bend radius of no greater than about 120 mil, more preferably no greater than about 70 mil, and even more preferably no greater than about 60 mil. Furthermore, the preferred flexible circuits are capable of withstanding at least about 50 cycles, and even more preferably 100 cycles, of bending to the minimum radius without failure.

The flexible circuits of the present invention and the cores thereof are preferably both highly tear-resistant and flexible. Thus, it is preferred, for example, that the cores of the present invention have an LAT of at least about 25 lb./mil and a minimum bend radius of no greater than about 50 mil. It is even more preferred that the core material of the present invention have an LAT of at least about 30 lb./mil and a minimum bend radius of no greater than about 25 mil. Furthermore, it is preferred, for example, that the flexible circuits of the present invention have an LAT of at least about 30 lb./mil and a minimum bend radius of no greater than about 120 mil.

In view of the disclosure contained herein, it is contemplated that those skilled in the art will be capable of readily selecting, without undue experimentation, materials which provide the beneficial features and characteristics of the present invention. While all such materials are within the scope of the present invention, applicant has found that especially beneficial results are obtained with core materials comprising polyamide fibers, and preferably aromatic polyamide fibers. Especially preferred among the aromatic polyamide fibers are those long chain synthetic polyamide fibers in which at least 85% of the amide linkages have an aromatic group attached to the carbon atom and an aromatic group attached to the nitrogen atom. Such preferred fibers are sold under the trademark KEVLAR by E.I. Du Pont Nemours and Company of Wilmington, De.

The particular configuration and orientation of the aramid fibers may be varied within the scope of the present invention. It is preferred, however, that the insulating core of the present invention comprise aramid fibers formed into a regular interlocking pattern, such as by weaving, knitting, or braiding, with woven fibers being preferred.

The polyamide fibers are preferably bound in a matrix of resin binder. Materials which are acceptable as the resin binder of the present invention will vary depending upon the particulars of each individual application. It is preferred, however, that the resin binder comprise epoxy resin, and even more preferably tetrafunctional epoxy resin. Accordingly, the cores of the present invention preferably comprises woven aramid fiber contained in a binder matrix of tetrafunctional epoxy resin. Such a material has been made available by Arlon-ESD under the designation "4093".

The advantages of the present invention are especially evident according to embodiments in which the present flexible circuits are used in combination with rigid circuit sections. Accordingly, a preferred aspect of the present invention provides printed circuit boards having at least one rigid section and at least one flexible circuit connected thereto. As described hereinbefore, previous rigid/flex circuit boards were extremely susceptible to failure, especially as a result of flexible circuit tear. Applicant has found that tearing of the flexible circuit sections of heretofore used rigid/flex circuit boards was initiated and/or concentrated around the interface or area of connection between the rigid and flexible printed circuits. While applicant does not intend to be bound by or limited to any particular theory, it is believed that the previous attempts to address the tearing problem have been unsuccessful, at least in part, because the source of the tearing problem went unrecognized. In particular, prior attempts to improve tear resistance typically involved the application of a covering layer only to that portion of the flexible circuit not connected to and/or not in contact with the rigid portion of the rigid/flex circuit board. For example, U.S. Pat. No. 4,800,461 describes the covering the flexible printed circuit with Kapton (polyamide) sheets in order to provide tear resistance characteristics to the flex sections. These Kapton sheets are disclosed as covering substantially only the flexible portion of the flexible printed circuit section, that is, substantially only the portion not in contact with the rigid circuit sections. Applicant believes that such an approach has been less than successful, at least in part, because it does not provide tear resistance to the flexible circuit in the region where most tearing has been found to originate—at the boundary or interface between the flexible and rigid sections.

Applicant has found that the failures of the prior art are overcome and tear resistance substantially improved by providing rigid/flex circuit board configurations in which the flexible circuit section comprises a highly tear-resistant core wherein at least a portion of this highly tear-resistant core is connected to the rigid circuit section. According to preferred embodiments, a portion of at least one of the planar surfaces of the core of the present invention is connected to at least a portion, and preferably a substantial portion, of at least one of the planar surfaces of the rigid circuit of the present invention. Connection of the planar surfaces can be achieved directly and/or indirectly. It is contemplated, for example, that connection of the core surface and the rigid circuit surface will include direct core/rigid circuit connection and indirect connection resulting from the core conductors being bound or otherwise connected to the surface of the rigid circuit section. Furthermore, it is preferred that at least about 5 percent of the area of the planar surface of the rigid circuit section be covered by, connected to or otherwise in contact with the core section of the flexible circuit, with at least 10 percent being more preferred and at least 20 percent being even more preferred. In this way, the rigid/flex circuit boards of the present invention possess high tear resistance in the area most susceptible to the initiation of tearing, that is, in the area of intersection between the rigid section and the flexible printed circuit. In especially preferred arrangements, a portion of the flexible section is substantially coextensive with the rigid circuit section, that is, about 100% of at least one planar surface area of the rigid Circuit section is covered by, connected to or other wise in contact with a portion of the core of the flexible circuit section.

Figure 2:
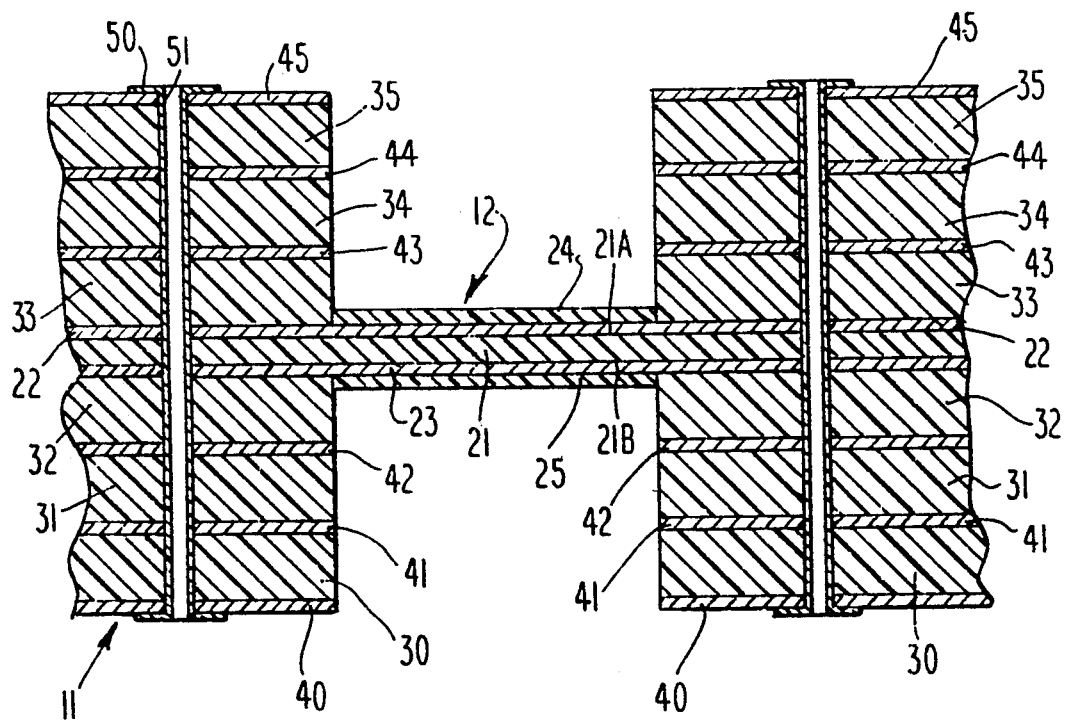
FIG. 2 is a cross-sectional view taken along lines 2—2 of FIG. 1.

With particular reference now to FIGS. 1 and 2, a rigid/flex printed circuit board according to the present invention, generally designated 10, has a plurality of rigid printed circuit sections 11 connected by a plurality of flexible printed circuit sections 12. The rigid printed circuits 11 are generally planar in construction and have relatively closely spaced upper and lower surfaces 11A and 11B, respectively, as shown in FIG. 2. Likewise, flexible printed circuits 12 are also generally planar in construction and have relatively closely spaced upper and lower surfaces. Thus, both the rigid and flexible printed circuits comprise relatively thin sheets in which the dimensions of the planar surfaces are many times larger than the edge dimensions. The rigid portions 11 carry various electronic components and hardware on one or more of the planar surfaces 11A and 11B. For the purposes of illustration, some of the electronic components shown in FIG. 1 have been designated with the reference numeral 13. As shown in cross-section in FIG. 2, the rigid circuit sections preferably comprise multiple layers of rigid circuits laminated together to form a unitary rigid circuit section.

As best shown in FIG. 2, the rigid circuit sections 11 generally comprise a series of conductors, such as printed circuits, separated by relatively rigid insulating sheets or layers. Thus, the rigid circuit sections 11 are multi-layer rigid circuit sections having conductors 40-45 separated from one another and/or other conductors by insulating layers 30-35. In a typical and well-known configuration, the insulating layers 30-35 comprise layers of fiberglass impregnated with epoxy adhesive. Such glass/epoxy layers result in a relatively rigid multi-layer circuit board when laminated together by heat and pressure according to well-known laminating techniques.

The flexible circuit sections 12 comprise conductors 23 and 22 laminated according to conventional methods to the upper and lower planar surfaces 21A and 21B of core layer 21, respectively. Core 21 extends into and is part of the rigid circuit sections 11. Conductors 22 and 23 also extend into rigid sections 11 and are electrically connected to rigid circuit conductors 40-45 by, for example, copper barrel 51. Pad 50 in turn provides means for obtaining electrical connection to electronic components 13. Conductors 22 and 23 may comprise conductive copper circuits printed according to techniques well known in the art on each side of core 21. Core 21 is preferably one or more layers of woven aramid fiber contained in a binder of tetrafunctional epoxy resin. According to preferred embodiments, core 21 has a thickness of from about 3 to about 5 mil.

According to an important aspect of the present rigid/flex circuit boards, core layer 21 comprises highly tear-resistant insulating material connected to the rigid circuit sections 11. More particularly, at least one of the upper and lower planar surfaces 21A and 21B of core 21 are bound, preferably adhesively bound, to at least one corresponding planar surface of the rigid circuit board. It is preferred that planar surfaces 21A and 21B are each bound to a mating planar surface of the rigid printed circuit board. Thus, at least a portion of upper surface 21A of core 21 is adhesively bound to at least a portion, and preferably a substantial portion, of the lower planar surface of prepreg layer 33, and at least a portion, and preferably a substantial portion, of lower surface 21B of core 21 is adhesively bound to at least a portion, and preferably a substantial portion, of the upper planar surface of prepreg layer 32. It is seen, therefore, that connection of core 21 to the rigid sections 11 is achieved by having substantial bonding between the planar surfaces of the core and the planar surfaces of the rigid printed circuit section. As mentioned hereinbefore, such bonding includes indirect bonding which results from the bonding of conductors 22 and 23 with the corresponding surfaces of prepreg layers 32 and 33, respectively. In multilayer embodiments of the type shown in the figures, this planar bonding is achieved by having the core 21 and the rigid circuit section laminated together. That is, both planar surfaces of the highly tear-resistant material of core 21 are bound during the lamination process to a planar surface of the rigid circuit board.

Copper conductors 22 and 23 are optionally but preferably covered by flexible insulator layers 24 and 25. These layers are covered with or have impregnated therein suitable adhesive for bonding to core 21 and conductors 22 and 23. The insulating layers 24 and 25 are thereafter laminated to the flexible portion of the sheet in known fashion. The present flexible printed circuits have an advantage over previously known circuits in that insulating layers 24 and 25 are optional, thereby allowing flexible printed circuits of reduced thickness and enhanced flexibility. In particular, since the tear resistance of the present flexible printed circuits is provided by the core layer and the manner in which the core layer is attached to the rigid circuit sections, the need for tear-resistant covering layers is eliminated. Elimination of the tear-resistant covering layers, in turn, provides circuit sections 12 with enhanced flexibility due to the reduction in the overall thickness of the flexible printed circuit layer. Furthermore, the use of highly tear resistant core 21 allows the thickness of any covering layer that is used to be substantially reduced relative to previous configurations. As a result, overall printed circuit thickness may be substantially reduced and flexibility increased even when insulating layers 24 and 25 are used.

Another advantage of the rigid/flex circuit boards of the present invention is that standard manufacturing techniques may be utilized, with little or no modification, to produce the printed circuit board. For example, the circuit boards may be produced using an initial processing step which includes providing the highly tear-resistant core 21. Copper sheets are then laminated to the core 21 in known fashion. Following lamination, the copper sheets are imaged and etched to provide copper conductors 22 and 23 on the core. Insulated prepreg sheets 30-32 and their associated conductors 40-42 are positioned below core 21, and insulated prepreg sheets 33-35 and their associated conductors 43-45 are positioned above core 21. The sandwich formed by the foregoing sheets is then laminated together and cut as required to provide, in this example, a multi-layer rigid/flex circuit. Holes are drilled at appropriate locations to interconnect desired conductors and then typically de-smeared by a suitable process to expose fully the copper conductors. The holes are then plated through to interconnect desired conductors via plated through barrel 51.

Many methods are known and available for manufacturing the rigid/flex printed circuit boards of the present invention. See, for example, the following patents, each of which is incorporated herein by reference: U.S. Pat. No. 4,931,134—Hatkevitz et al; 4,800,461—Dixon et al; 4,338,149—Quaschner; 3,409,732—Dahlgren et al.

The flexible printed circuits of the present inventions are especially well suited for use in complex electronic equipment. Accordingly, this invention provides computing equipment, preferably portable computing equipment such as lap-top and notebook computers, comprising the flexible circuits of the present invention.

It will be understood that the above-described embodiments of the present invention are illustrative only of the present invention and not limiting thereof. Accordingly, it will be understood that various changes and alterations may be made in the above-described embodiments without departing from the essential features of the invention, which are defined only by the claims which follow.

What is claimed is:

1. A printed circuit board comprising:
   (a) at least first and second rigid printed circuit sections;
   (b) a flexible printed circuit comprising first and second conductors and a core having an LAT of at least 25 lb./mil separating and supporting said conductors, said flexible circuit having a minimum bend radius of no greater than 120 mil and wherein:
      (i) at least a first portion of said flexible core is connected to said first rigid printed circuit section;
      (ii) at least a second portion of said flexible core is connected to said second rigid printed circuit section;
      (iii) at least a third portion of said flexible core extends beyond the periphery of each of said rigid printed circuit sections; and
      (iv) at least one of said conductors electrically connects said first rigid printed circuit section to said second rigid circuit section, said flexible printed circuit thereby providing a tear-resistant electrical connection between said first rigid printed circuit section and said second rigid printed circuit section.

2. The printed circuit board of claim 1 wherein:
   (a) said first and second rigid printed circuit sections comprise circuit sections having at least one generally planar surface thereof;
   (b) said core includes at least one generally planar surface;
   (c) at least a first portion of said generally planar core surface is bonded to at least a portion of the generally planar surface of said first rigid circuit section; and
   (d) at least a second portion of said generally planar core surface is bonded to at least a portion of the generally planar surface of said second rigid printed circuit section.

3. The printed circuit board of claim 2 wherein at least 5% of said generally planar surface of said first rigid printed circuit section is bound to said core and at least 5% of said generally planar surface of said second rigid circuit section is bound to said core.

4. The printed circuit board of claim 3 wherein said core has a minimum bend radius of no greater than 50 mil.

5. The printed circuit of claim 4 wherein said core has an LAT value of at least 28 lb./mil.

6. The printed circuit of claim 5 wherein the core has an LAT value of at least 30 lb./mil.

7. The printed circuit of claim 1 wherein said core comprises polyamide fiber.

8. The printed circuit board of claim 1 wherein said core comprises aromatic polyamide fiber.

9. The printed circuit board according to claim 8 wherein said fibers comprise woven fibers.

10. A portable computer comprising the printed circuit board of claim 1.

11. An improved printed circuit board comprising:
    (a) a rigid printed circuit section; and
    (b) a flexible printed circuit comprising a flexible, highly tear-resistant insulating core having an LAT value of at least 25 lb./mil, at least a first portion of said core being connected to said rigid circuit section, said flexible printed circuit having a minimum bend radius of no greater than 120 mil.

12. The printed circuit board of claim 11 wherein said core has an LAT value of at least 28 lb./mil and a minimum bend radius of no greater than 50 mil.

13. The printed circuit board according to claim 12 wherein said core has an LAT value of at least 30 lb./mil.

14. The printed circuit board according to claim 11 wherein said core has a minimum bend radius of no greater than 30 mil.

15. The printed circuit board according to claim 11 wherein said core comprises woven aromatic polyamide fiber.

16. The printed circuit board according to claim 15 wherein said core includes at least one generally planar surface and further comprising an electrical conductor supported on said planar core surface.

17. The printed circuit board according to claim 16 further comprising a second electrical conductor and wherein said core separates and supports said conductors.

18. A portable computer comprising the printed circuit board of claim 11.

19. A flexible, tear-resistant printed circuit having a minimum bend radius of no greater than 120 mil. and comprising at least first and second electrical conductors and a flexible, insulating core having an LAT value of at least 25 lb./mil separating and supporting said first and second conductors, said core comprising aromatic polyamide fiber in a matrix of resin binder.

20. The printed circuit of claim 19 having an LAT value of least 25 lb./mil and a minimum bend radius of no greater than 120 mil.

21. The printed circuit according to claim 20 having an LAT value of at least 28 lb./mil and a minimum bend radius of no greater than 70 mil.

22. A flexible printed circuit board having a minimum bend radius of at lest 120 mil. and comprising a first electrical conductor and an insulating core having an LAT value of at least 25 lb./mil supporting said first conductor.

23. The printed circuit board according to claim 22 wherein said core has an LAT value of at least 30 lb./mil and a minimum bend radius of no greater than 25 mil.

24. The printed circuit board according to claim 22 having a minimum bend radius of no greater than 70 mil.

25. The printed circuit board according to claim 24 wherein the core has an LAT value of at least 30 lb./mil.

26. The printed circuit according to claim 25 wherein said core comprises aromatic polyamide fiber.

27. The printed circuit board according to claim 26 wherein said fiber comprises woven fibers.

28. The printed circuit board according to claim 27 wherein said core further comprises epoxy resin binder.

29. A portable computer comprising the printed circuit board of claim 22.

30. The printed circuit board according to claim 22 wherein said core has an LAT value of at least 28 lb./mil and a minimum bend radius of no greater than 50 mil.

* * * * *